United States Patent
Tung

(10) Patent No.: US 6,861,918 B2
(45) Date of Patent: Mar. 1, 2005

(54) COMPENSATION CIRCUIT FOR CURRENT CONTROL OSCILLATOR

(75) Inventor: Yen-Chang Tung, Jubei (TW)

(73) Assignee: ENE Technology Inc., Hsin-Chu (TW)

( * ) Notice: Subject to any disclaimer, the term of this patent is extended or adjusted under 35 U.S.C. 154(b) by 73 days.

(21) Appl. No.: 10/455,305

(22) Filed: Jun. 6, 2003

(65) Prior Publication Data

US 2004/0051596 A1 Mar. 18, 2004

(30) Foreign Application Priority Data

Sep. 16, 2002 (TW) .......................... 91121176 A

(51) Int. Cl.$^7$ ............................................. H03B 27/00
(52) U.S. Cl. ...................... 331/185; 331/57; 327/157
(58) Field of Search .................. 331/185, 57; 327/157, 327/111, 278

(56) References Cited

U.S. PATENT DOCUMENTS

| 5,142,249 | A | * | 8/1992 | Hirotomi | 331/57 |
| 5,463,353 | A | * | 10/1995 | Countryman et al. | 331/2 |
| 6,404,258 | B2 | * | 6/2002 | Ooishi | 327/278 |
| 6,756,838 | B1 | * | 6/2004 | Wu et al. | 327/536 |

* cited by examiner

*Primary Examiner*—Robert Pascal
*Assistant Examiner*—Joseph Chang
(74) *Attorney, Agent, or Firm*—Troxell Law Office PLLC

(57) ABSTRACT

A compensation circuit for current control oscillator to correct the frequency curve of an oscillator includes a compensation circuit which has a plurality of P transistors and N transistors to improve stabilization of output frequency of the digital current control oscillator and to prevent the digital current control oscillator from occurring unlatching phenomenon in certain frequency zones.

9 Claims, 4 Drawing Sheets

COMPENSATION CIRCUIT FOR CURRENT CONTROL OSCILLATOR

BACKGROUND OF THE INVENTION

1. Field of the Invention

The invention relates to a compensation circuit for current control oscillator and particularly to a compensation circuit adopted for use in digital current control oscillator to improve resolution of oscillation frequency and frequency curve and provide stable frequency output for the digital current control oscillator to prevent unlatching phenomenon from occurring in certain frequency zones of the digital current control oscillator.

2. Description of the Prior Art

Refer to FIG. 1 for the basic principle of a conventional technique adopted on digital current control oscillator. In a conventional digital current control oscillator (as shown in FIG. 1), at the initial state the discharge transistor switch 13b in ON and the charge transistor switch 13a is OFF. The discharge power supply 11b provides a ground channel to enable the discharge power of the equivalent load capacitor 15 be greater than the charge power. Hence the potential of the first signal point m1 increases while the potential of the second signal point m2 drops. When the voltage of the second signal point m2 is below the low threshold voltage ($V_{TL}$) of a controller 100, a feedback signal is generated to turn off the discharge transistor switch 13b of the equivalent load capacitor 15, and to turn on the charge transistor switch 13a at the same time. The charge power supply 11a provides the required power supply. Thus the charge power of the equivalent load capacitor 15 is greater than the discharge power. Therefore the potential drop of the first signal point m1 causes the potential increase of the second signal point m2. When the voltage of the first signal point m1 is greater than the high threshold voltage ($V_{TH}$) of the controller 100, a feedback signal is generated to turn on the discharge transistor switch 13b of the equivalent load capacitor 15, and to turn off the charge transistor switch 13a at the same time. Thus the discharge power of the equivalent load capacitor 15 is greater than the charge power. The phenomena set forth above repeatedly occur, and an oscillation is generated.

Refer to FIG. 2 for the circuit of a conventional digital current control oscillator. The charge transistor switch 13a consists of a plurality of P transistors connecting in series. The discharge transistor switch 13b consists of a plurality of N transistors connecting in series. The controller 100 controls the number of the switches thereby to control current and oscillation frequency. The controller 100 has a trigger 20 to control the high threshold voltage value and the low threshold voltage value, thereby to control charge and discharge voltage to determine charge and discharge current, and consequently to adjust the oscillation frequency of the oscillator. For instance, when the charge voltage value transmitted to the controller 100 from the equivalent load capacitor 15 reaches the high threshold voltage of the trigger 20, a discharge process occurs, and the trigger 20 provides high low potential signals to the PMOS controller 23a and NMOS controller 23b through an inverter 21. Meanwhile the P bits controller 27a and N bits controller 27b determine the switch number of P transistor 25a in each charge transistor switch 13a and the switch number of N transistor 25b in each discharge transistor switch 13b. The P bits controller 27a connects to PMOS controller 23a through a P controller line p2. Accordingly, a low potential signal transmitted to the charge transistor switch 13a through the P bus p1 is OFF. The N bits controller 27b connects to the MNOS controller 23b through a N control line n2, and a high potential signal is transmitted to the discharge transistor switch 13b through the N bus n1 to make the discharge transistor switch 13b in an ON condition. Based on the aforesaid explanation, when the potential of the first signal point m1 is greater than the second signal point m2, it is a discharge process. The P connection end p3 and N connection end n3 transmit 0 and 1, i.e. OFF and ON signals.

The foregoing setup has problems. For instance, when the charge power is constant, the switch of discharge power is affected and consequently determines variation time of the potential. Same phenomenon occurs vice versa. Hence controlling these switches affects the frequency output of the digital current control oscillator. For example, if only one P transistor 25a is ON in the charge transistor switch 13a, and five are ON the next moment, because of the existence of the switches and different number of the switches at different stages of the process, the switching of the switches will generate a parasite load capacitance. This will affect the potential variation time and result in undesirable frequency output. The invention aims at providing a compensation circuit for current control oscillator to overcome the problem of parasite load.

SUMMARY OF THE INVENTION

The object of the invention is to provide a compensation circuit for current control oscillator to improve the parasite load phenomenon occurred to the conventional digital current control oscillator resulting from switching of multiple switches. The invention includes a compensation circuit that contains a plurality of transistor switches to connect to a conventional digital oscillator that contains a plurality of transistor switches for controlling and coinciding the number of the switches to enable the output frequency and the control signal to have coincided alterations thereby to prevent the digital current control oscillator from occurring unlatching phenomenon in certain frequency zones, and also to eliminate the parasite effect and to avoid generating non-linear alterations of output frequency resulting from this effect.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
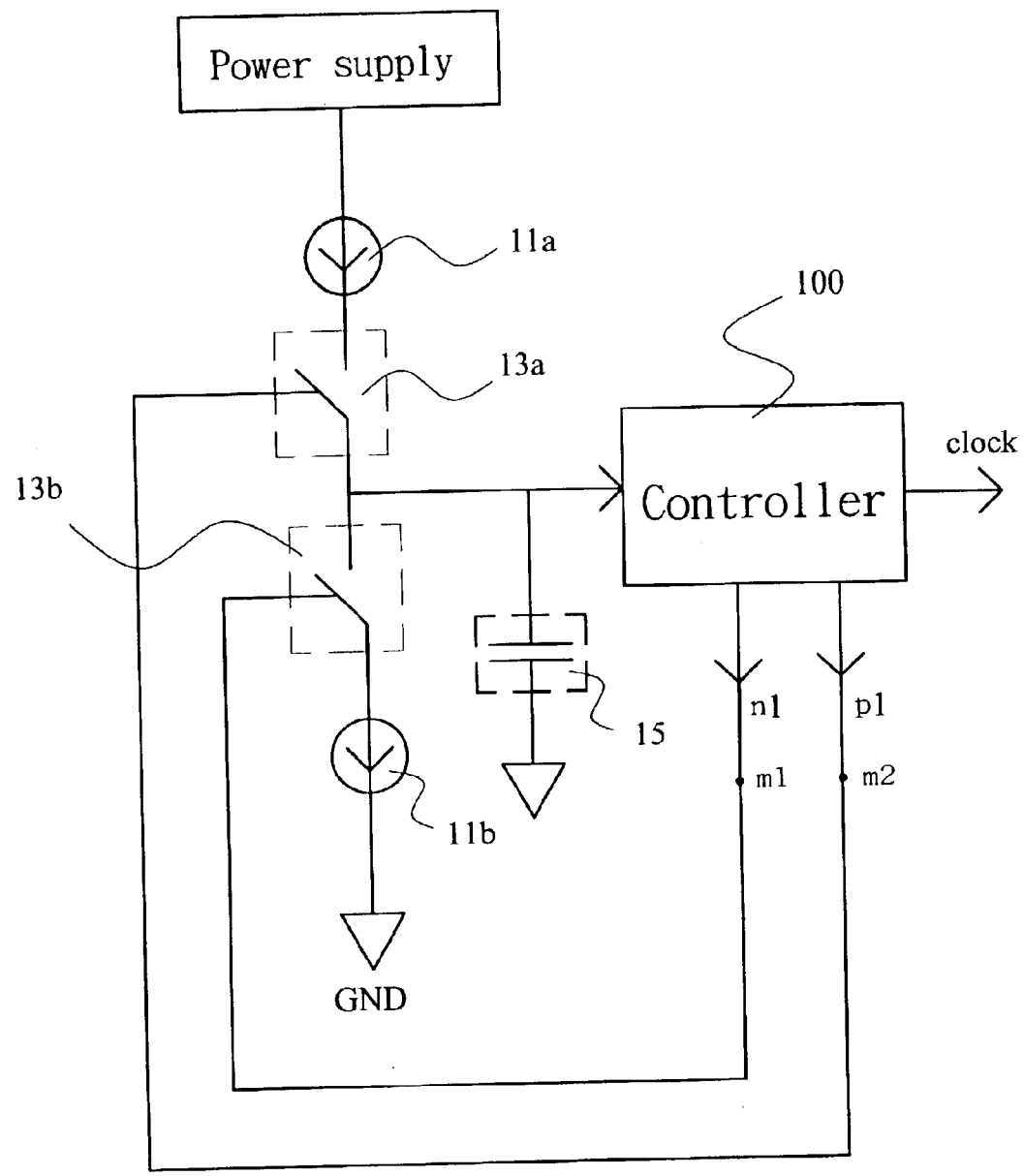
FIG. 1 is a schematic diagram showing the basic principle of a conventional digital current control oscillator.
Figure 2:
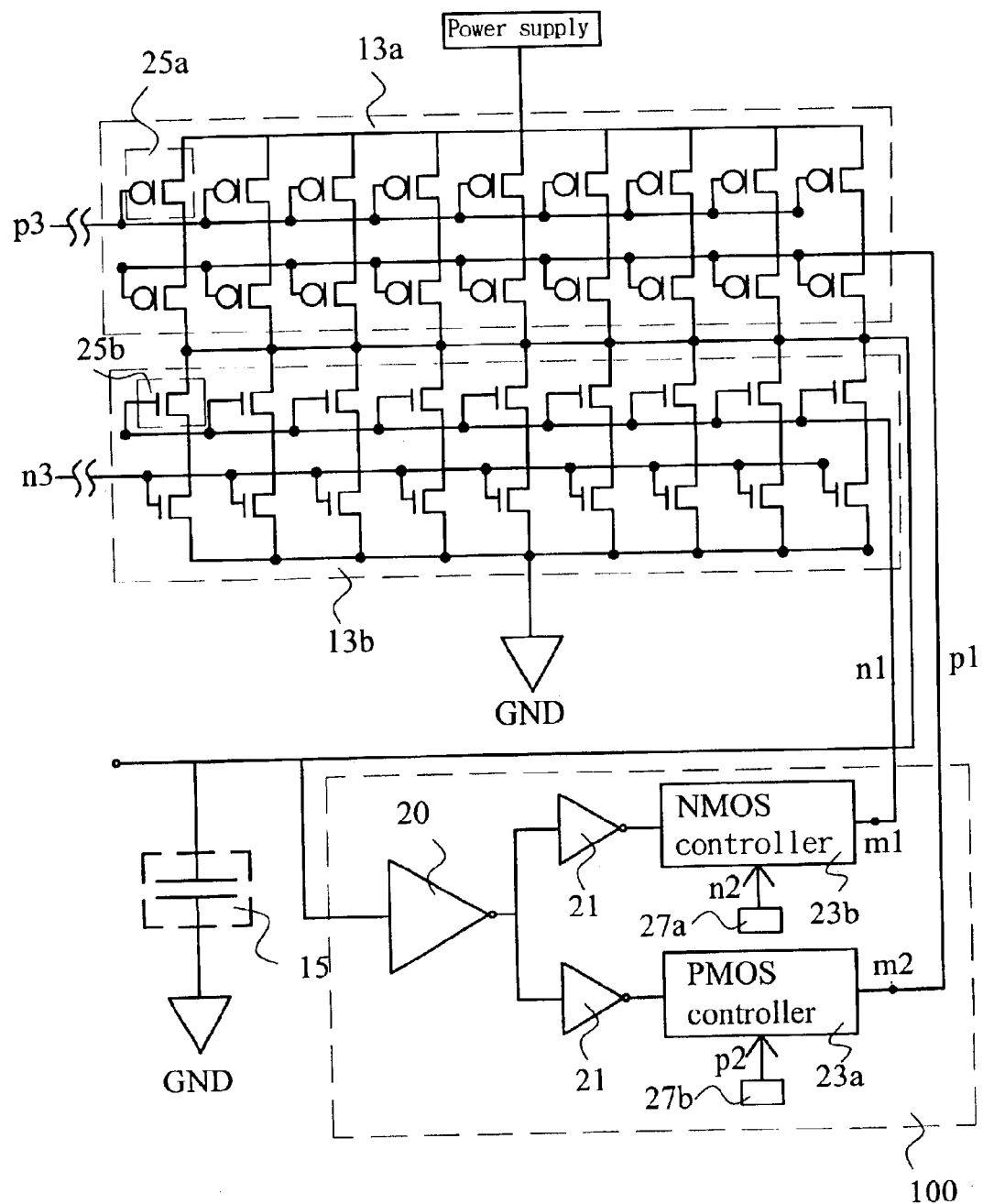
FIG. 2 is a schematic diagram of circuit connections for a conventional digital current control oscillator.
Figure 3:
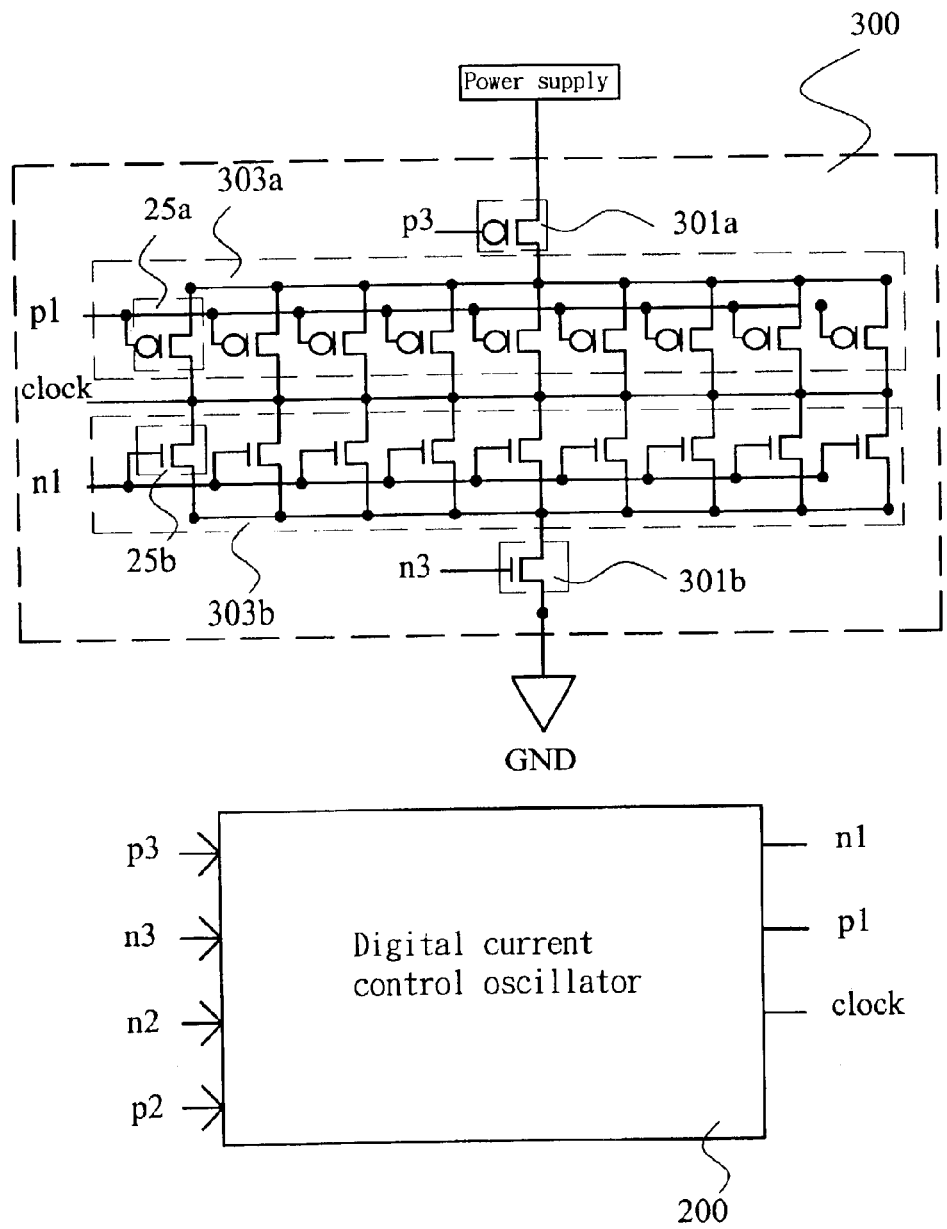
FIG. 3 is a schematic diagram of a digital current control oscillator coupled with the compensation circuit according to a first embodiment of the invention.

Refer to FIG. 3 for the digital current control oscillator coupled with the compensation circuit according to a first embodiment of the invention. A conventional digital current control oscillator 200 has a P bus p1 and N bus n1 connecting to a compensation circuit 300. The compensation circuit 300 includes a P compensation circuit 303a which has one end connecting to a P connection end p3 of the digital current control oscillator 200 through a P passage switch 301a, and a N compensation circuit 303b which has one end connecting to a N connection end n3 of the digital current control oscillator 200 through a N passage switch 301b. The compensation circuit 300 consists of a P compensation circuit 303a and a N compensation circuit 303b that are formed by connecting a plurality of P transistors 25a and N transistors 25b in series. As the digital current control oscillator 200 will occur parasite load phenomenon due to different number of charge and discharge transistor switches, the compensation circuit 300 can synchronize the internal transistor switch number through the controller 100, and to complement the switch number of the compensation circuit 300 with the digital current control oscillator 200 thereby to reach same total switch number and eliminate the parasite effect. When the potential at the first signal point m1 of the conventional digital current control oscillator 200 is higher than the second signal point m2, it is in a discharge condition for the equivalent load capacitor 15. The discharge transistor switch 13b is ON, and the charge transistor switch 13a is OFF. And the N connection end n3 of the discharge transistor switch 13b connects to an ON N passage switch 301b, the P passage switch 301a is OFF. Thus the number of ON N transistor 25b in the discharge transistor switch 13b is given to a plurality of N transistors 25b in the N compensation circuit 303b that connect to the N bus for compensation. Next, when the equivalent load capacitor 15 is charged, the P transistor 25a in the P compensation circuit 303a also gives a plurality of P transistors 25a in the compensation circuit 300 that connect to the P bus according to the number of ON P transistor 25a in the charge transistor switch 13a for compensation. Meanwhile, the P passage switch 301a is ON, and the N passage switch is OFF. According to aforesaid operations, total ON and OFF transistor numbers are the same before and after charge and discharge processes. Therefore the parasite load and non-linear phenomena caused by different signals are eliminated. And the object and effect of the invention may be achieved.

Figure 4:
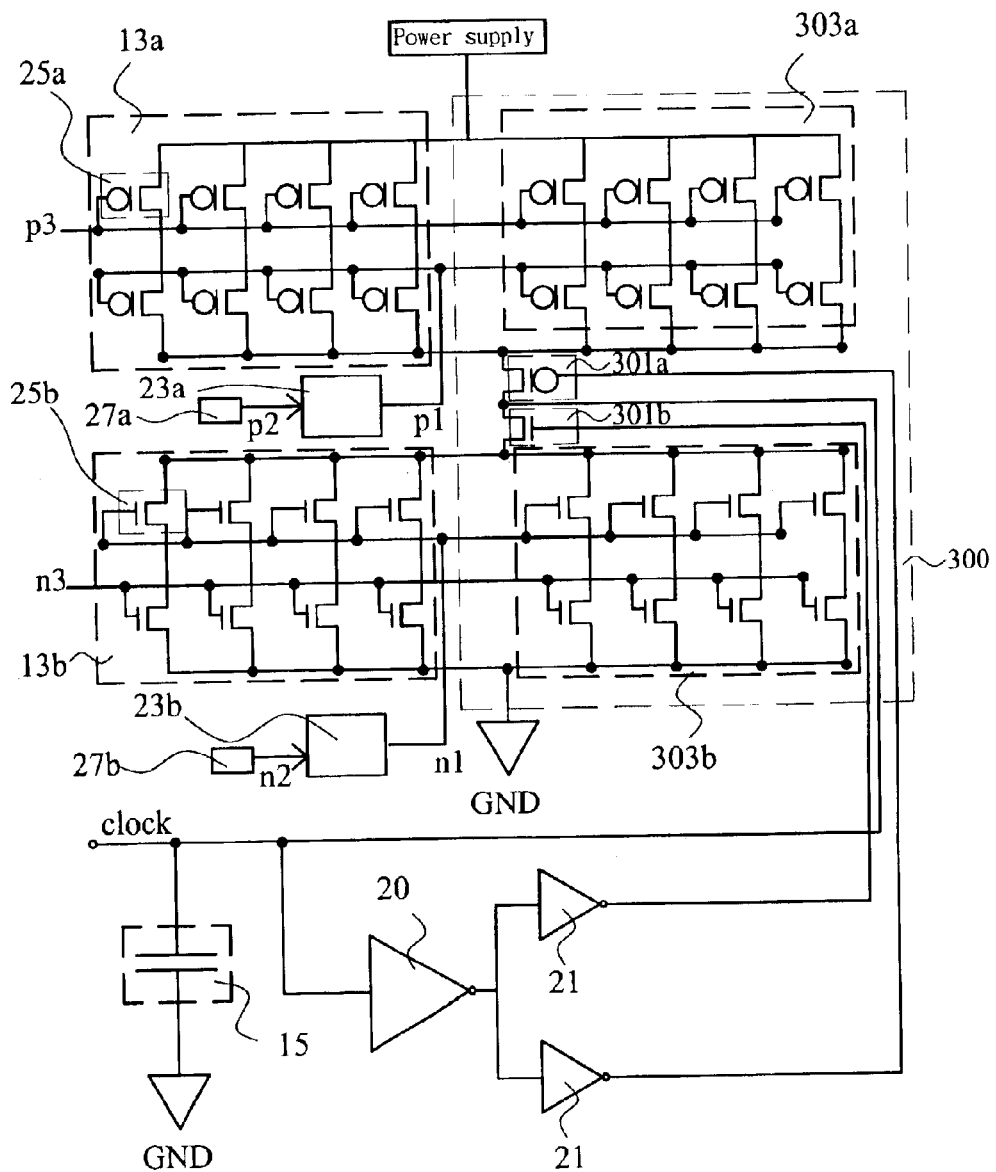
FIG. 4 is a schematic diagram of a digital current control oscillator coupled with the compensation circuit according to a second embodiment of the invention.

Referring to FIG. 4 for the digital current control oscillator coupled with the compensation circuit according to a second embodiment of the invention. In this embodiment the number of P transistors 25a and the N transistors 25b in the compensation circuit 300 is constant. The P transistors 25a in the charge transistor switch 13a follow the control of the PMOS controller 23a to adjust the transistor switch number connecting to the P bus. The P passage switch 301a is ON when the equivalent load capacitor 15 is charging, and is OFF while discharging. On the other hand, The N transistors 25b in the discharge transistor switch 13b follow the control of the NMOS controller 23b to adjust the transistor switch number connecting to the N bus. The N passage switch 301b is ON when the equivalent load capacitor 15 is discharging, and is OFF while charging. In this embodiment, the characteristics of the transistors (MOS) contained in the charge transistor switch 13a, discharge transistor switch 13b, P compensation circuit 303a and N compensation circuit 303b in the compensation circuit 300 may be changed by altering the ratio of length and width and number according to practical design. As the switch number of the P transistors 25a and the N transistors 25b in the compensation circuit 300 is constant, and is not adjusted in different situations, in the event that the number of the P transistors 25a that are ON in the charge transistor switch 13a during charging is same as the N transistors 25b that are ON in the discharge transistor switch 13b during discharging, the compensation effect of the invention can be achieved. If the numbers of charging and discharging transistors are different, because of the compensation circuit 300 includes a plurality of transistors, the impact of the parasite load and nonlinear current resulting from different number of switches being changed over may be reduced, and an acceptable compensation effect may still be achieved.

In addition, in the embodiments of the invention, the control of PMOS controller 23a and MNOS controller 23b may be changed to simple charging or discharging function. I.e. controlling the charge transistor switch 13a in an ON condition, and the discharge transistor switch 13b in an OFF condition, or the discharge transistor switch 13b in an ON condition while the charge transistor switch 13a in an OFF condition.

In summary, the compensation circuit for current control oscillator includes a compensation circuit 300 which has a P compensation circuit 300a and a N compensation circuit 300b that consist of a plurality of transistors to improve the parasite load phenomenon occurred during repetitive charging and discharging, and also resolve the problems of parasite load and nonlinear frequency variations of the output frequency resulting from nonlinear current caused by different transistor switch number of the charge transistor switch 13a and the discharge transistor switch 13b, thereby prevents the digital current control oscillator from occurring unlatching phenomenon in certain frequency zones.

While the preferred embodiments of the invention have been set forth for the purpose of disclosure, modifications of the disclosed embodiments of the invention as well as other embodiment thereof may occur to those skilled in the art. Accordingly, the appended claims are intended to cover all embodiments which do not depart from the spirit and scope of the invention.

I claim:

1. A compensation circuit for current control oscillator having an external compensation circuit connecting to a digital current control oscillator through a P bus and a N bus, comprising:
   a P compensation circuit;
   a N compensation circuit;
   a P passage switch connecting to the digital current control oscillator through a P connection end; and
   a N passage switch connecting to the digital current control oscillator through a N connection end.

2. The compensation circuit for current control oscillator of claim 1, wherein the P compensation circuit includes a plurality of P transistors.

3. The compensation circuit for current control oscillator of claim 1, wherein the N compensation circuit includes a plurality of N transistors.

4. The compensation circuit for current control oscillator of claim 1, wherein the P compensation circuit connects to the digital current control oscillator through a P bus.

5. The compensation circuit for current control oscillator of claim 1, wherein the N compensation circuit connects to the digital current control oscillator through a N bus.

6. The compensation circuit for current control oscillator of claim 1, wherein the switch number of the P transistors in the P compensation circuit is controlled by a PMOS controller.

7. The compensation circuit for current control oscillator of claim 1, wherein the switch number of the N transistors in the N compensation circuit is controlled by a NMOS controller.

8. The compensation circuit for current control oscillator of claim 1, wherein the P compensation circuit connects to a charge transistor switch through a P passage switch and a P connection end.

9. The compensation circuit for current control oscillator of claim 1, wherein the N compensation circuit connects to a discharge transistor switch through a N passage switch and a N connection end.

* * * * *